United States Patent
Oksanen et al.

(10) Patent No.: US 9,219,188 B2
(45) Date of Patent: Dec. 22, 2015

(54) OPTOELECTRONIC SEMICONDUCTOR STRUCTURE AND METHOD FOR TRANSPORTING CHARGE CARRIERS

(76) Inventors: Jani Oksanen, Espoo (FI); Jaakko Tulkki, Helsinki (FI)

(*) Notice: Subject to any disclaimer, the term of this patent is extended or adjusted under 35 U.S.C. 154(b) by 103 days.

(21) Appl. No.: 14/240,524

(22) PCT Filed: Aug. 24, 2011

(86) PCT No.: PCT/FI2011/050738
§ 371 (c)(1),
(2), (4) Date: Jun. 23, 2014

(87) PCT Pub. No.: WO2013/026948
PCT Pub. Date: Feb. 28, 2013

(65) Prior Publication Data
US 2014/0299892 A1  Oct. 9, 2014

(51) Int. Cl.
*H01L 27/15* (2006.01)
*H01L 33/00* (2010.01)
*H01L 33/02* (2010.01)
*H01L 31/0352* (2006.01)
*H01L 31/068* (2012.01)
*H01L 33/38* (2010.01)

(52) U.S. Cl.
CPC .... *H01L 33/0008* (2013.01); *H01L 31/035272* (2013.01); *H01L 31/068* (2013.01); *H01L 33/02* (2013.01); *H01L 33/38* (2013.01)

(58) Field of Classification Search
CPC ............ H01L 33/0008; H01L 31/0352; H01L 31/035272
USPC ......................................................... 257/79
See application file for complete search history.

(56) References Cited

U.S. PATENT DOCUMENTS

| 6,228,669 B1 | 5/2001 | Kondo et al. |
| 2004/0109666 A1 | 6/2004 | Kim |
| 2011/0053312 A1 | 3/2011 | Teppe et al. |

*Primary Examiner* — Elias M Ullah

(57) ABSTRACT

An optoelectronic semiconductor structure (20) comprises an n-type semiconductor region (3); a p-type semiconductor region (1); a p-n junction formed between the n-type and p-type semiconductor regions; and an active region (2). According to the present invention, the optoelectronic semiconductor structure (20) is configured to transport, when in use, charge carriers between the active region (2) and each of the re¬ type semiconductor region (3) and the p-type semiconductor region (1) through a single substantially planar boundary surface (9) of the active region.

15 Claims, 2 Drawing Sheets

OPTOELECTRONIC SEMICONDUCTOR STRUCTURE AND METHOD FOR TRANSPORTING CHARGE CARRIERS

TECHNICAL FIELD OF THE INVENTION

The present invention relates generally to semiconductor devices emitting or absorbing electromagnetic radiation, e.g. visible light. In particular, the present invention relates to optoelectronic semiconductor structures performing the actual conversion between electrical and radiant energy in those devices. The present invention also relates to methods for transporting charge carriers in such optoelectronic semiconductor structures.

BACKGROUND ART

A great variety of optoelectronic semiconductor structures for converting electrical energy into light, or vice versa, are known.

Key elements of an optoelectronic semiconductor structure meant here comprise an n-type semiconductor material region and a p-type semiconductor material region forming a p-n junction therebetween, and an active region where the actual energy conversion takes place. In light emitters like light emitting diodes (LEDs) and semiconductor lasers, charge carriers injected into the active region by supplying a current through the p-n junction recombine via radiative recombination, thereby emitting light. In structures for energy conversion in the opposite direction, e.g. in photovoltaic cells, charge carriers are generated in the active region via absorption of incident electromagnetic radiation. These carriers are collected to the opposite sides of the p-n junction, thereby generating an electric current in the circuitry into which the structure is connected.

One key design parameter of optoelectronic semiconductor structures is the overall efficiency of the structure. For example, for both light emitting and light receiving structures, the active region taking part in the energy conversion should preferably cover as large a portion of the area of the structure as possible. From operational point of view, one of the most important issues in optimizing the efficiency of an optoelectronic semiconductor structure is the optimization of the current transport between the active region and the p- and n-type semiconductor regions. Particularly in light emitters, the electric current should be spread as uniformly as possible over the entire active region. A non-uniform current density can result in undesired local overheating of the structure at the locations of a high current density. Moreover, non-uniformity of the current density can also increase the non-radiative recombination, thereby decreasing the energy conversion efficiency of the structure. In addition to the uniform current density, optimizing the current transport properties of an optoelectronic semiconductor structure also comprises minimizing the overall resistive losses within the structure.

Prior art optoelectronic semiconductor structures are typically implemented as layered configurations with an active layer superposed between an n-type semiconductor layer and a p-type semiconductor layer. Carrier transport into or from the active region of such optoelectronic structures conventionally takes place via the n-type and p-type layers on opposite sides of the active layer. Forming the contacts to the n-type or p-type layer below the active layer often requires the active region being partly cut off. This is the case e.g. in conventional edge-emitting LED structures having the n-and p-type contacts formed on the same side of the layered structure. Said partial cut-off naturally decreases the portion of the device area covered by the active region. Moreover, due to the internal resistances of the contact layers forming the electrical interfaces of the structure, uniform current distribution necessitates that the contacts lie relatively close to each other and that the sizes of them are limited. In practice, these requirements restrict the maximum area of the active region of high power LED structures to be of the order of 1 mm$^2$.

On the other hand, in vertically emitting structures and in light receiving structures like photovoltaic cells, the surface of the optoelectronic semiconductor structure forming the interface through which light is coupled between the structure and the ambient is partly covered by one of the contact structures. Typically this contact structure is formed as an opaque metallic grid extending essentially over the entire area of the active layer. This kind of contact structure partially obscures the light path between the active layer and the ambient, thereby again decreasing the effective area of the active region.

In both of the contacting schemes described above, the requirements of uniform current density and low resistive losses require perforations in the active layer distributed with typically less than 100 µm separations or contact grids covering several percent of the surface area of the structure.

PURPOSE OF THE INVENTION

It is a purpose of the present invention to provide an optoelectronic semiconductor structure and method for transporting charge carriers in an optoelectronic semiconductor structure, the structure and method enabling efficient current spreading and low resistive losses, preferably without the above-described limitations of the prior art solutions.

DEFINITIONS

One essential feature in different preferable embodiments of the present invention is the use of diffusion-assisted current transport in an optoelectronic semiconductor structure. In the following, the different current components in an optoelectronic semiconductor structure and the concept of diffusion-assisted current transport are discussed before going into the summary of the present invention.

Two main current components in an optoelectronic semiconductor structure are drift current and diffusion current. Drift current is electron or hole current that is caused by an electric field typically generated by a potential difference between contact structures connected to the p-type and n-type semiconductor regions. Diffusion current is electron or hole current that is caused by spatial gradients in electron or hole density, respectively. The direction of the electron current density is opposite to the electron flux.

Current spreading is a current transport process which spreads out the electrons and holes so that their density in the active region becomes as uniform as possible. In typical configurations where different elements of the structure are implemented as stacked layers, this means spreading the current within the direction of the planes of those layers, i.e. laterally.

Current transport and spreading in conventional bipolar optoelectronic semiconductor devices, like light emitting diodes and photovoltaic cells, is typically dominated by drift currents resulting in electrons and holes travelling approximately in opposite directions along the electric field lines. This is particularly the case for the currently dominating structures based on a stack of substantially planar layers, wherein large band gap p-type and n-type semiconductor materials are located on opposite sides of an active region with a smaller band gap.

In general, the operation of light emitters and absorbers can be divided in three phases. In emitters these phases are i) the generation of excess electrons and holes by current injection through the p-n junction; ii) the transport of the excess electrons and holes by drift and diffusion; and iii) the radiative recombination of the electron-hole pairs. In absorbers the corresponding phases are i) the generation of electron hole pairs via absorption of incident light; ii) the transport of the generated electrons and holes to the n-type and p-type doped regions by diffusion and drift; and iii) the separation of the electrons and holes to the p-type and n-type doped materials allowing generation of an electric current in an external circuit. In conventional devices the phase ii) does not play an essential role—the structures are designed so that recombination or generation preferably takes place in the active region that is located in between the p-type and n-type layers, and current spreading takes place mainly by drift in the p-and n-type materials. This design principle, however, often leads to compromises in the efficiency of the current spreading and/or in the integrity of the active region of the device.

In this document the concept of diffusion-assisted current transport, or current transport by means of diffusion, current transport meaning here also current spreading, is defined by the relations of local electron and hole diffusion current densities to the corresponding drift current densities. Current transport is called diffusion-assisted if at least one of the following conditions is met: I) the direction of the electron or hole diffusion current density deviates from the direction of the drift current density by at least 10°, and has a non-negligible component (at least 10% of the total drift current density) that is perpendicular to the drift current; II) the diffusion current density has a component antiparallel to the drift current density and the antiparallel component is larger than the drift current density; III) the drift current is negligible (less than 10%) in comparison to the diffusion current. In less precise terms, current transport is diffusion-assisted when diffusion current dominates or makes electrons and/or holes to travel in a direction deviating from the direction corresponding to the electric field. Generally this only can take place in structures that are truly two dimensional or three dimensional, with the exception of leakage current out of the active region in a 1 dimensional structure.

SUMMARY OF THE INVENTION

The first aspect of the present invention relates to an optoelectronic semiconductor structure comprising an n-type semiconductor region; a p-type semiconductor region; a p-n junction formed between the n-type and p-type semiconductor regions; and an active region.

By an optoelectronic semiconductor structure is meant here both light emitting structures for light emitters and light receiving structures for light absorbers. As defined in the background section, light emitters in this document refer to bipolar devices where an external power source is used to inject carriers—electrons and holes—into the device which, as a result, emits light. Respectively, light absorbers are bipolar devices that absorb light and may generate external currents. The emitted or absorbed light may also be used internally in the structure for some other purpose, like photocatalytic conversion or energy transfer.

The optoelectronic semiconductor structure of the present invention can be an entire operable unit forming a light emitting or absorbing semiconductor component or device. On the other hand, the term "structure" refers to the fact that the optoelectronic semiconductor structure can also form an integral, non-separable part comprised in a light emitting or absorbing component or device. Particularly, this means that one or more of the different regions of the optoelectronic semiconductor structure can extend as a continuous structure also outside the optoelectronic semiconductor structure.

In addition to the basic p-n junction formed between a p-type and n-type doped semiconductor regions, p-n junction is meant here to cover also all variations of a junction between a p-type and n-type semiconductor regions, including e.g. a p-i-n junction comprising an intrinsic semiconductor region between those two regions of different conductivity types. In a preferred approach, the junction does not include the material of the active region, though in some embodiments the active material may be required to form the junction.

The active region is a part of the optoelectronic structure where the bulk of the useful carrier recombination in light emitting structures, or carrier generation in light absorbing structures, takes place. Preferably, the active region is made of a direct band gap material with a band gap smaller than in the surrounding materials. The active region can also comprise several materials and internal structures like quantum wells or quantum dots. One optoelectronic semiconductor structure of the present invention may comprise several separate active regions, e.g. a plurality of nanoparticles like nanowires.

According to the present invention, the optoelectronic semiconductor structure is configured to transport, when in use, charge carriers between the active region and each of the n-type semiconductor region and the p-type semiconductor region through a single, substantially planar boundary surface of the active region. In other words, the optoelectronic semiconductor structure according to the present invention is configured to enable transport of both n-type and p-type charge carriers into or from the active region, depending on whether the structure is configured to emit or receive light, through one single planar boundary surface of the active region. Thus, in the case of a light emitting structure, charge carriers are injected from the p-type and n-type regions to the active region from the same side of the active region. Respectively, in light receiving structures according to the present invention, both p-type and n-type charge carriers are transported from the active region to the same side thereof. This is a dramatic change in comparison to the prior art where the flows of p-type and n-type charge carriers are typically directed to or from the opposite sides of the active region.

The optoelectronic semiconductor structure according to the present invention can be configured for transporting electrons and holes through said boundary surface at different areas thereof. On the other hand, the boundary surface can also be formed by a single interface between the active region and another material of the structure so that both electrons and holes are transported through this same interface.

It is not necessary for the basic principle of the present invention that all charge carriers are transported in the structure as defined above. However, it is preferable that at least a majority of the electric currents between the active region and the p-type and n-type regions flow as defined above.

As explained in more detail below, the basic principle of the present invention opens entirely new possibilities for designing optoelectronic semiconductor structures. Configuring the optoelectronic semiconductor structure to guide the charge carrier flows as defined above makes it possible to design the structure to simultaneously meet the requirements of the overall efficiency of a device utilizing said structure, uniform current density over the active region, and low resistive losses. Configurations are possible where the active region covers the entire structure area, and where the entire active region contributes to the optoelectronic energy conversion.

With the basic principle of current transport according to the present invention given, there is a great variety of alternative possibilities to design the actual configuration of the optoelectronic semiconductor structure.

In one preferred approach, the optoelectronic semiconductor structure according to the present invention is configured to generate, when in use, diffusion-assisted current spreading in a direction deviating from the direction of the electric field within the structure. Thus, in this approach, at least a part of the current spreading in the structure is driven by diffusion, i.e. by spatial gradients in electron and/or hole densities. Diffusion-assisted current spreading, and diffusion-assisted current transport in general, enables placement of the p-type and n-type semiconductor regions in novel ways which provide entirely new possibilities in comparison to the prior art solutions relying on drift as the sole current transport mechanism. Diffusion can initiate current flows in any direction deviating from the drift current driven by the electric field, e.g. perpendicularly with respect to that.

In embodiments utilizing the diffusion-assisted current spreading, the distance from any point of the active region to take part in the emission to the nearest point of the n-type semiconductor region is preferably less than or equal to five times, more preferably less than or equal to twice the diffusion length of electrons. A similar requirement applies for holes and the p-type material, the relevant diffusion length being that of holes. Those dimensions ensure effective diffusion-assisted current spreading in and into the active region, which allows uniform distribution of recombination throughout the active region. By diffusion length is meant in this document the average distance travelled by an excess electron or hole along a given path before it recombines with a hole or an electron, respectively, and excess electrons and holes are carriers that are generated by light or current injection. Under excitation, most minority carriers in doped regions and nearly all electrons and holes in the depleted or intrinsic regions are excess carriers as, without excitation, their densities near or below room temperature are typically extremely small. If not otherwise stated, in doped materials the diffusion length refers to the diffusion length of minority carriers, and in intrinsic materials to the diffusion length of electrons or holes, whichever is the smaller.

Limiting the distance of each of the p-type and n-type semiconductor regions from the active region as defined above ensures in most geometries that the diffusion can efficiently spread the current in the direction of a fictitious plane connecting the adjacent p-type and n-type semiconductor regions.

In one preferred embodiment, diffusion-assisted current transport is implemented in an optoelectronic semiconductor structure, wherein the p-n junction lies substantially outside the active region, and wherein the optoelectronic semiconductor structure is configured to generate, when in use, diffusion-assisted transport of charge carriers between the active region and each of the n-type semiconductor region and p-type semiconductor region. Location substantially outside the active region means that the most of the p-n junction volume lies outside the active region. Thus, in this embodiment, diffusion is used to initiate and guide the current transport between the active layer and the p-type and n-type semiconductor regions.

In one embodiment utilizing the diffusion-assisted current transport between the p-type and n-type semiconductor regions and the active region, the optoelectronic semiconductor structure comprises further a passivation region adjacent to the active region, and the boundary surface of the active region, through which the charge carriers are transported between the active region and each of the n-type semiconductor region and the p-type semiconductor region, is formed by the interface between the passivation region and the active region. In this embodiment, the passivation region serves for passivation of the active region, thereby reducing the surface recombination on the edges of the active region and enabling flexible positioning and configuration of the p-type and n-type semiconductor regions. The presence of the passivation region means that the carriers are transported into or from the active region via the passivation region. The passivation region can be fabricated to form a high-quality interface with the active region, thereby avoiding a situation where poor interfaces between the active region and some of the p-type and n-type regions would deteriorate the performance of the structure. Moreover, the passivation region participates in the current spreading.

To ensure efficient diffusion-assisted current transport between the active region and each of the p-type and n-type semiconductor regions, the distance between the boundary surface, through which the current is transported, and any of the n-type semiconductor region and the p-type semiconductor region is less than or equal to five times, preferably less than or equal to twice the corresponding diffusion length of the carriers. The term "distance" is used here in its normal meaning, i.e. to refer to the smallest spacing between the boundary surface and any of the n-type and the p-type regions, measured in a direction perpendicular to the boundary surface. This range has found to be suitable for most configurations.

An efficient and preferable way to utilize diffusion in charge carrier transport is to combine the above preferred embodiments by configuring the optoelectronic semiconductor structure so that diffusion contributes both to the current spreading in the direction along a plane connecting the adjacent p-type and n-type semiconductor regions, and to the current transport between the p-type and n-type semiconductor regions and the active region.

The basic principles of the present invention are not limited to some particular geometry of the structure and its elements. However, the active region is preferably formed as an active layer, preferably extending substantially through the entire optoelectronic semiconductor structure. In addition to enabling maximal utilization of the structure area, a layer-formed active region is also a convenient choice from the manufacturing point of view. A layer preferably covering the entire structure can be formed by known epitaxial processes. In the case of a layer-formed active region, the n-type semiconductor region and the p-type semiconductor region lie preferably on the same side of the active layer. "Side" is defined in this document with respect to a fictitious plane in the direction of which a layer, here the active layer, extends, i.e. has its maximum dimensions; a plane always has two opposite sides.

In one preferred embodiment of the present invention, the passivation region is formed as a passivation layer preferably extending substantially through the entire optoelectronic semiconductor structure, and the n-type semiconductor region, the p-type semiconductor region, and the active region lie on the same side of the passivation layer. This configuration enables to have the p-type and n-type semiconductor regions as well as the active region as a grid or array on only one side of the structure. The thickness of the structure can thereby be minimized. Moreover, this is also a preferable configuration for an active region in the form of a three-dimensional nanometer-scaled structure, e.g. a nanowire.

As a second aspect, the present invention is focused on a semiconductor device comprising an optoelectronic semiconductor structure as defined above. As already stated above, in such device, the optoelectronic semiconductor structure can form a part of a light emitting diode. In another preferred embodiment, the optoelectronic semiconductor structure is part of a photovoltaic cell. Naturally, one single device can comprise also more than one optoelectronic semiconductor structures, and even both light emitting and light receiving structures.

A third aspect of the present invention relates to a method of transporting charge carriers in an optoelectronic semiconductor structure comprising an n-type semiconductor region; a p-type semiconductor region; a p-n junction formed between the n-type and p-type semiconductor regions; and an active region.

According to the present invention, the method comprises transporting charge carriers between the active region and each of the n-type semiconductor region and the p-type semiconductor region through a single, substantially planar boundary surface of the active region. The details of this principle as well as the advantages thereby provided are explained above in the context of the first aspect of the present invention.

Preferably, the method comprises utilization of diffusion so that charge carriers are transported by means of diffusion at least in one of the following: spreading current in a direction deviating from the direction of the electric field within the structure; and transporting charge carriers between the active region and each of the n-type semiconductor region and the p-type semiconductor region. Evidently, the same principles can also be applied to similar structures made of inorganic semiconductors.

BRIEF DESCRIPTION OF THE FIGURES

Some of the preferred embodiments of the present invention are explained in more detail in the following with reference to the accompanying figures.

It is important to note that the drawings in the figures are simplified and schematic representations only, and that the drawings are not in scale. In the drawings, the corresponding elements in different embodiments are marked by the same reference numbers.

DETAILED DESCRIPTION OF THE INVENTION

Figure 1:
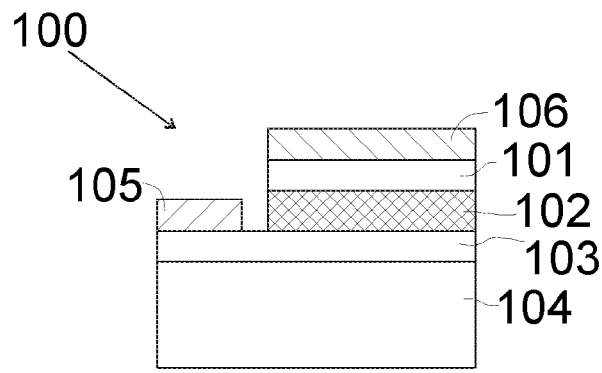
FIG. 1 shows a cross section of a typical LED structure according to the prior art.

FIG. 1 shows a cross section of a double heterojunction light emitting diode LED 100 as an example of a conventional layered optoelectronic semiconductor structure and device. The LED is formed as a layered structure comprising an active layer 102 sandwiched between layer-form regions of a first and a second doped semiconductor materials 101, 103. One of those two doped semiconductor layers is formed of a material which is doped with acceptor type impurities and the other is formed of a material doped with donor type impurities. In other words, one of the layers is a p-type semiconductor layer and the other forms an n-type semiconductor layer. In this kind of structure, a p-n junction is formed between these layers around the active layer.

The LED 100 of FIG. 1 is formed on a substrate or support layer 104 formed of a suitable material, which often is non-conducting.

In the LED 100 of FIG. 1, the electrons and holes are injected into the active region 102 from opposite sides of the active layer. Current injection into the active region takes place through ohmic contacts formed in between metallic contact electrodes 105, 106 fabricated on the p-type and n-type materials 101, 103. Forming the metallic contact electrode 105 on the lower doped semiconductor layer 103 requires perforation of the active layer 102 and the other doped semiconductor layer 101 as well as the metallic contact structure 106 thereon. This decreases the portion of the overall structure area covered by the active layer. On the other hand, particularly in devices where the single structure unit of FIG. 1 is repeated to form an array of a plurality of such structure units, the perforation increases the surface area of the active region, and thereby increases non-radiative recombination of the injected charge carriers through the surface states. This reduces the efficiency of the device.

To reach uniform current density and thus uniform light emission throughout the active layer 102, the size of the active layer must be limited according to the current spreading capacity by drift current in the doped semiconductor layers 101, 103, and the upper contact electrode 106. This implies that in the conventional structures, the maximum width of the active layer is of the order of a few hundred micrometers in most visible spectrum high power devices.

As an alternative to the LED of FIG. 1, the basic configuration of the optoelectronic semiconductor structure can be also implemented as a structure fabricated on a conducting substrate. Then the contact electrodes are usually formed on the opposite sides of the structure. One of them is typically a continuous structure covering the entire structure area, whereas the other electrode is often fabricated as a conductive grid on the side of incident light of the structure. This kind of structure can be utilized e.g. in a photovoltaic cell or a vertical LED. This configuration removes the need to perforate the active region. However, the contact electrode grid partly blocks the path of light into or out of the device, again reducing the effective area of the active layer, i.e. the portion of the structure area covered by the active layer.

Figure 2A:
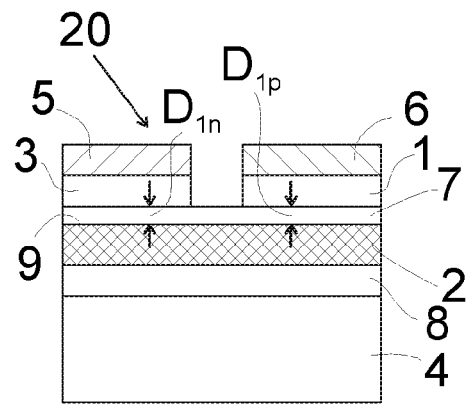
FIGS. 2 to 5 illustrate as cross sections optoelectronic semiconductor structures according to the present invention.
Figure 2B:
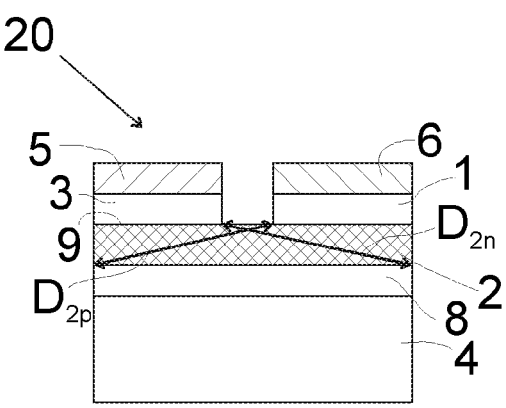

FIGS. 2a and 2b show LED structures 20 according to the present invention. Like the prior art LED of FIG. 1, also each of the structures 20 of FIGS. 2a and 2b is formed on a non-conducting substrate layer 4 and comprises an active layer 2 and a p-type and n-type semiconductor regions 1, 3. The p-type and n-type semiconductor regions 1, 3 can have any topology and geometry and they can be formed, for example, as stripe, squares, and circles. Contact electrodes 6, 5 are formed on the p-type and n-type semiconductor regions 1, 3. A buffer layer 8 is located between the active layer 2 and the substrate 4. In the structure of FIG. 2a, a passivation layer 7 is formed on the other side of the active layer.

The active layer can be formed of any suitable semiconductor material known in the art. It can also comprise any known special structures like quantum wells, wires or dots, and/or several sub-layers of different materials that allow tuning the emission wavelength to different wavelengths and enable, for example, direct white light emission. The accurate composition(s) of the active material(s) or the surrounding materials may also be graded to reduce the height of the potential barriers which may contribute to the resistive losses in the structure.

As an essential difference with respect to the structure of FIG. 1, in the structures 20 of FIGS. 2a and 2b, the active layer covers the entire area of the structure. This is enabled by that the structures are configured to transport, in a light emitting structure, both holes and electrons from the p-type and n-type semiconductor regions, respectively, to the active layer via the same planar boundary surface 9 of the active layer. In other words, the electrons and holes as excess carriers generated via current injection through the p-n junction are transported into the active layer 2 from the same side thereof. In the structure of FIG. 2a, said boundary surface 9 is formed by the interface between the passivation layer and the active layer 2. In other words, the electrons and holes are both transported into the active layer from the passivation layer 7. In the structure of FIG. 2b, the boundary surface 9 is the upper boundary surface of the active layer 2.

The passivation layer 7 functions as a passivation layer on the surface of the active layer, isolates the possible lower quality interfaces between e.g. the p-type semiconductor region 1 and the passivation layer 7, and also participates in the carrier spreading. The passivation layer 7 can be of either doped or intrinsic semiconductor and can be formed of the same material as the p-type and the n-type semiconductor regions. If the passivation layer 7 is doped with acceptors, a p-n junction is formed at the interface of the passivation layer 7 and the n-type semiconductor region 3. If the material of the passivation layer 7 is intrinsic, the p-n (or p-i-n) junction is formed between those three material regions.

The LED structures of FIGS. 2a and 2b can be fabricated e.g. with the following process and materials. A sapphire substrate (4) is first overgrown by a standard GaN buffer layer (8) by the metallo-organic vapor phase epitaxy (MOVPE) process. The buffer layer is followed by e.g. five 3 nm thick InGaN quantum wells with suitable In composition, separated by 10 nm thick GaN barriers, forming the active region (2). Next a 100 nm thick p-GaN passivation layer (7) is grown on the active region, followed by a 300 nm n-GaN layer which will form the n-type region (3). The n-GaN layer is patterned and openings for growing the p-GaN regions are made by etching. The areas where p-GaN will not be grown are defined and covered by SiN, after which p-GaN (1) is grown on the areas without SiN. Finally the n-and p-GaN regions are contacted by contact metals (5, 6) and connected to contact pads allowing for connecting external power sources or loads. A corresponding structure can be fabricated also with other material systems, e.g. conventional InP/InGaAs materials where InP replaces GaN and sapphire substrate and the active material is made of InGaAs. This material system may be used for example in fabricating large area thermophotonic components. Device simulations have shown that low resistive losses and uniform light emission can be achieved in optimized structures.

In the LED of FIG. 2b, said current transport through one common boundary surface 9 is achieved by having the p-type and n-type semiconductor regions 1, 3 formed on the active layer 2, wherein the drift current flows through the active layer and diffusion current spreads carriers within the active region. In the LED of FIG. 2a having the passivation layer 7 between the active region 2 and the p-type and n-type semiconductor regions, the situation is different in that the active layer lies substantially outside the p-n junction formed between the p-type and n-type semiconductor regions. When in use, the electric field generated within the structure by coupling an external power supply between the contact electrodes 5, 6 drives a drift current between the p-type and n-type regions via the passivation layer 7. The active layer 2 lies essentially outside the current flow path in the sense that a current flow would exist between the n-type and the p-type regions in the presence of an electric field even if the active layer were replaced by an ideal insulator. However, the structure of FIG. 2a is adjusted, i.e. the materials, geometry, and dimensions of the structure are selected so that diffusion induces a current flow component so as to ensure efficient current transport to the active layer. The details of performing this adjustment are discussed in more detail in the following.

The thickness of the passivation layer 7 naturally affects the efficiency of the diffusion of the carriers to the active layer from the p-n junction. In configuring the structure of FIG. 2a for diffusion-assisted current transport to the active layer 2, it is thus essential that the thickness of the passivation layer 7 is chosen so that diffusion can efficiently transport the carriers into and in the active region 2. For efficient operation, the thickness should generally be at most of the order of a few diffusion lengths of the minority carriers. The diffusion length, in turn, depends on several factors like the actual materials in the structure, doping of those materials, lifetime of the carriers, as well as the thickness of the passivation layer 7. Generally the diffusion length is in the range of 1 to 10 µm. The maximum thickness of the passivation layer 7 depends on many factors like the electron and hole mobilities and the presence of potential barriers and polarization fields within the optoelectronic semiconductor structure. In many cases, it is more efficient to limit the thickness to be even much smaller than the diffusion length. In general, to ensure efficient current transport to the active layer 2, the distance $D_{1n}$, $D_{1p}$ between the boundary surface 9 of the active region through which the carrier transport takes place and any of the p-type and n-type semiconductor regions 1, should be most preferably less than or equal to twice the diffusion length of the carriers.

In addition to the diffusion-assisted current transport between the active region and each of the p-type and n-type semiconductor regions, the structures 20 of FIGS. 2a and 2b are also configured to optimize the lateral current spreading in the direction along the plane of the active layer by means of diffusion. In other words, the locations and dimensions of the p-type and n-type semiconductor regions 1, 3 are selected to achieve efficient diffusion-assisted current spreading in this direction, as well as low resistive losses. In practice, this means that the widths and separation of adjacent regions of different conductivity types should also be limited to at most a few diffusion lengths of the carriers. The exact dimensions depend on how uniform current spreading is required, whether the structure comprises the passivation layer 7, and on the exact material and other properties of each element of the structure. When highly uniform current spreading is required, the overall width of the basic structure unit should be at most in the range of 3 to 8 diffusion lengths. Most preferably, the distance from any point of the active region to the nearest point of any of the n-type semiconductor region and the p-type semiconductor region is less than or equal to twice the diffusion length of the charge carriers. To illustrate the determination of these distances, arrows $D_{2n}$, $D_{2p}$ showing the longest possible distances from "any point" of the active region to the "nearest" points in the n-type and the p-type regions, respectively, are marked in FIG. 2b. These distances are determined similarly also in the case of the structure of FIG. 2a having the passivation layer 7.

The passivation layer 7 and the active layer 2 can also be doped non-uniformly and/or have non-uniform layer thicknesses to improve carrier spreading in the active layer. For example, one or both of these layers can have a position dependent dopant density or gradually changing material composition optimized, for example, to reduce the height of potential barriers caused by abrupt material changes or polarization surface charges caused by piezoelectric materials, thereby facilitating diffusion over the barriers.

In addition to having an active layer 2 configured to emit light at one wavelength, alternatively the active layer can be divided into several active regions emitting at different wavelengths, which allows even direct generation of white light without using phosphors.

The buffer layer 8 can be a doped or an intrinsic element grown on top of the substrate 4. Preferably, also the doping profile and material composition of this layer is adjusted to minimize the potential barriers therein and at the interfaces between this and the adjacent layers. The buffer layer may act as a passivation layer of the active region and also participate in the lateral current transport of the carriers.

This layer is not strictly necessary and can also be missing. Substrate 4 can also be doped or intrinsic and in some embodiments it can also be missing from the final structure.

Instead of a light emitting structure for a LED, each of the basic structures 20 of FIGS. 2a and 2b could be fabricated also as a light receiving structure for e.g. a photovoltaic cell. In the case of a light receiving structure, an external light source creates electrons and holes mainly in the active layer 2, from where they are transported and spread by means of diffusion and/or electric field to the p-n junction. Both types of carriers are transported to the same side of the active region via the same planar boundary surface 9 of the active layer. The electric field in the p-n junction separates electrons and holes and allows transporting a part of the received light energy to an external load through the contact electrodes 5, 6. Thus, the direction of the charge carrier flows are directed oppositely with respect to a LED, i.e. from the active region to the p-n junction and further to the p-type and the n-type semiconductor regions. What is stated above concerning the details of the configuration of the structure to allow efficient diffusion-assisted current transport and current spreading, applies, mutatis mutandis, also to the case of a light receiving structure.

Figure 3:
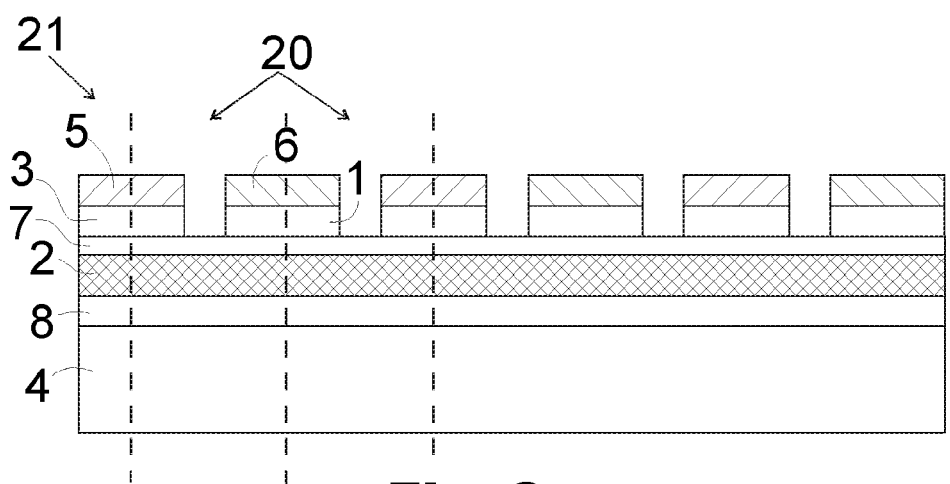

As one very essential advantage thereof, the optoelectronic semiconductor structure 20 according to the present invention can be repeated to form large-area arrays of single structure units. FIG. 3 shows an example where the basic structure unit according to FIG. 2a is multiplied this way to form a large-area LED array 21. In this kind of configuration, the effective area of the continuous active layer 2 extending throughout the entire array can be scaled to be arbitrarily large without the need to etch any holes in it. This allows minimizing the edge area of the active region, thereby reducing the non-radiative recombination which is the strongest at etched surfaces where the number of surface defects is the largest. The plurality of p-type and n-type semiconductor regions 1, 3 and contact electrodes 6, 5 thereon are arranged alternately as a grid at one side of the array. The adjacent semiconductor regions and the electrodes thereon are separated by a suitably selected distance allowing efficient diffusion-assisted current spreading in the direction of the plane of the active layer and transport of electrons and holes from the p-n junction to active region.

Figure 4:
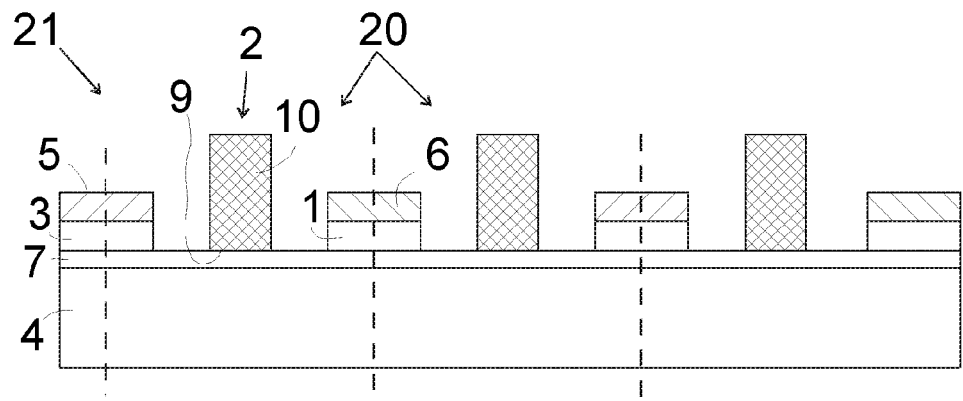

FIG. 4 shows an alternative embodiment of a repeated array 21 of optoelectronic semiconductor structures 20, where the active region 2 of each structure unit comprises a nanowire 10. The p-type and n-type regions 1, 3 and the nanowires lie on the same side of a passivation layer 7. The boundary surface 9 of the active region through which the both types of carriers are transported in use is formed at the interface between the nanowire 10 and the passivation layer 7. The use of nano-scaled structures of materials having direct band gap tuned to the desired photon energy as the active regions may offer several advantages over bulk materials. These advantages can comprise e.g. improved emission efficiency and stronger optical coupling to the optical modes of free space, and wider range of available band gap energies enabling better control of the wavelength of the emitted light. In an alternative embodiment, the substrate 4 can be missing and nanometer-scaled elements can be grown directly on the bottom surface of a combined passivation/support layer.

Figure 5:
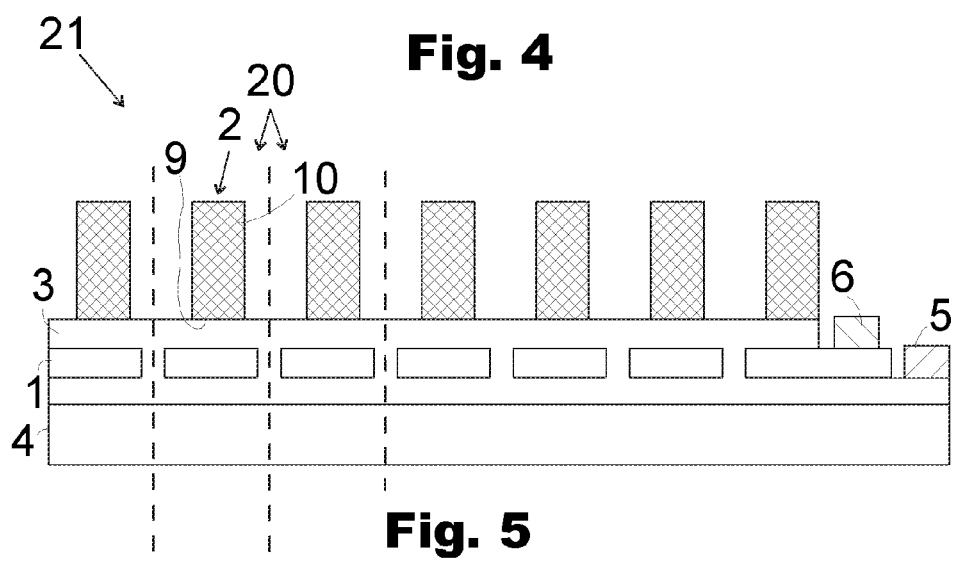

FIG. 5 shows yet an alternative embodiment of an array 21 of optoelectronic semiconductor structures 20, where the p-type regions 1 are embedded within a continuous n-type layer 3 so that the p-n junctions are buried within the structure. Though not visible in the cross-sectional view of FIG. 5, the p-type regions 1 are connected to each other as a continuous structure to allow electrical contacting of all of them via the same contact electrode 6. The active regions 2 are formed as a nanowire 10 forest grown on the surface of the structure. In the structures 20 of FIG. 5, the boundary surface 9 of the active region through which the both types of carriers are transported in use is formed at the interface between the nanowire 10 and the n-type layer 3.

Figure 6:
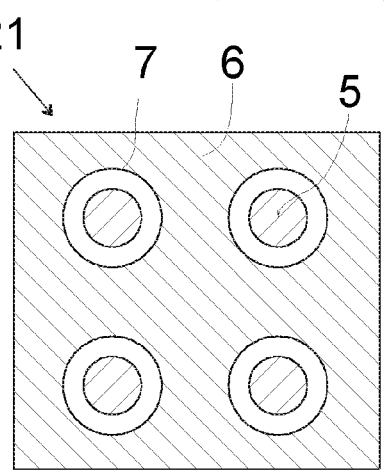
FIGS. 6 and 7 show, as top views, possible layouts of devices utilizing optoelectronic semiconductor structures according to the present invention.
Figure 7:
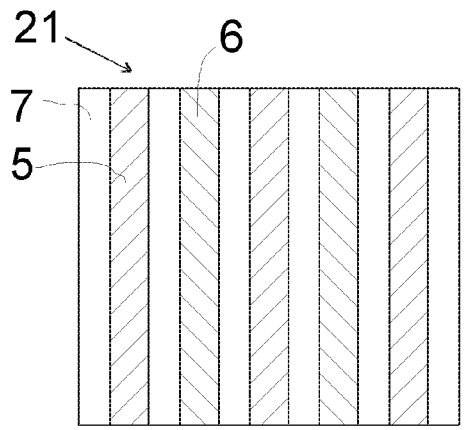

The layouts of FIGS. 6 and 7 illustrate possible ways to organize an array 21 of optoelectronic semiconductor structures according to the present invention to form a large-area device. The basic layer configuration of the structures in the array is that of FIG. 2a. In FIG. 6, the assembly of the p-type semiconductor layer and the contact electrode 6 thereon is formed as a continuous structure extending over the entire array. Openings are arranged in this assembly, thereby exposing the passivation layer 7. Islands of n-type semiconductor regions and the contact electrodes 5 thereon are located in these openings. In FIG. 7, the p-type and n-type regions together with the associated electrodes 6, 5 are arranged as alternating stripes extending over the entire width of the array.

In the above, the embodiments of the present invention are discussed at a general level focusing on the basic principles only. This is because it is clear that it is standard engineering for a person skilled in the art knowing the basic principle of the invention to design the details of the structures using the common general knowledge in the art.

In addition to using conventional semiconductor substrates, certain embodiments of the invention can be fabricated on other substrate materials, such as glass plates. This offers the possibility of fabricating cheaper and larger area devices than what is possible with currently available semiconductor substrates, and enables e.g. fabrication of large area solar cell devices.

In order to improve the coupling of the optical modes inside the optoelectronic semiconductor structure and the free space, various surface treatment methods can be applied. These include roughening the surfaces, coating the surfaces with plasmonic light coupling structures, layered structures for creating antireflection patterns, or using lenses, Fresnel lenses, or other structures with suitable geometry to increase the probability that emitted photons are extracted from/captured into the semiconductor optoelectronic structure.

Optoelectronic semiconductor structures according to the present invention can be manufactured by processes and equipment as such known in the field of semiconductor technology. Those processes comprise e.g. different variations of epitaxial growth, ion implanting, and sputtering. Etching and/or selective growth can be used to form three-dimensional regions of different elements of the structure. For example, an n-type semiconductor layer 3 can be grown on a passivation layer 7 formed in the previous stages of the process, after which parts of this layer is etched away to form sites for the p-type regions 3. P-type material can then be grown on these sites. In this case, the interface between the passivation layer 7 and the p-type region 3 may contain a high defect density causing strong non-radiative recombination of the carriers. To avoid this, the materials and structural parameters of the structure as well as the actual processes for each manufacturing step should be selected carefully.

The foregoing description provides non-limiting examples of certain embodiments of the invention only. As is clear to a skilled person, the invention is not restricted to the presented embodiments or the details thereof.

In this document, the term comprise is used as an open expression not meant to be limiting in any way.

Some of the features of the presented embodiments can be utilized without using other features. As such, the foregoing description shall be considered as merely illustrative examples of the principles of the present invention, and not as limiting implementations thereof. The scope of the invention is only restricted by the appended patent claims.

The invention claimed is:

1. An optoelectronic semiconductor structure comprising an optoelectronic semiconductor structure comprising an n-type semiconductor region; a p-type semiconductor region; a p-n junction formed between the n-type and p-type semiconductor regions; and an active region; characterized in that the optoelectronic semiconductor structure is configured to transport, when in use, charge carriers between the active region and each of the n-type semiconductor region and the p-type semiconductor region through a single substantially planar boundary surface of the active region such that, in the case of a light emitting structure, charge carriers are injected from the p-type and n-type regions to the active region from the same side of the active region and, in the case of a light receiving structure, p-type and n-type charge carriers are transported from the active region to the same side thereof.

2. An optoelectronic semiconductor structure as defined in claim 1, wherein the optoelectronic semiconductor structure is configured to generate, when in use, diffusion-assisted current spreading in a direction deviating from the direction of the electric field within the structure.

3. An optoelectronic semiconductor structure as defined in claim 1, wherein the distance from any point of the active region to the nearest point of any of the n-type semiconductor region and the ptype semiconductor region is less than or equal to five times, preferably less than or equal to twice the corresponding diffusion length of the charge carriers.

4. An optoelectronic semiconductor structure as defined in claim 1, wherein the p-n junction lies substantially outside the active region, and wherein the optoelectronic semiconductor structure is configured to generate, when in use, diffusion-assisted transport of charge carriers between the active region and each of the n-type semiconductor region and the p-type semiconductor region.

5. An optoelectronic semiconductor structure as defined in claim 1, further comprising a passivation region adjacent to the active region, wherein the boundary surface is formed by the interface between the passivation region and the active region.

6. An optoelectronic semiconductor structure as defined in claim 5, wherein the passivation region is formed as a passivation layer preferably extending substantially through the entire optoelectronic semiconductor structure, and wherein the n-type semiconductor region, the p-type semiconductor region, and the active region lie on the same side of the passivation layer.

7. An optoelectronic semiconductor structure as defined in claim 1, wherein the distance between the boundary surface and any of the n-type semiconductor region and the p-type semiconductor region is less than or equal to five times, preferably less than or equal to twice the corresponding diffusion length of the charge carriers.

8. An optoelectronic semiconductor structure as defined in claim 1, wherein the active region is formed as an active layer preferably extending substantially through the entire optoelectronic semiconductor structure.

9. An optoelectronic semiconductor structure as defined in claim 8, wherein the n-type semiconductor region and the p-type semiconductor region lie on the same side of the active layer.

10. A semiconductor device comprising an optoelectronic semiconductor structure according to claim 1.

11. A semiconductor device as defined in claim 10, wherein the optoelectronic semiconductor structure is part of a light emitting diode.

12. A semiconductor device as defined in claim 10, wherein the optoelectronic semiconductor structure is part of a photovoltaic cell.

13. A method for transporting charge carriers in an optoelectronic semiconductor structure comprising an n-type semiconductor region; a p-type semiconductor region; a p-n junction formed between the n-type and p-type semiconductor regions; and an active region; characterized in that the method comprises transporting charge carriers between the active region and each of the n-type semiconductor region and the p-type semiconductor region through a single substantially planar boundary surface of the active region such that, in the case of a light emitting structure, charge carriers are injected from the p-type and n-type regions to the active region from the same side of the active region and, in the case of a light receiving structure, p-type and n-type charge carriers are transported from the active region to the same side thereof.

14. A method as defined in claim 13, wherein the method comprises spreading current in a direction deviating from the direction of the electric field within the optoelectronic semiconductor structure by means of diffusion.

15. A method as defined in claim 13, wherein the method comprises transporting charge carriers between the active region and each of the n-type semiconductor region and the p-type semiconductor region by means of diffusion.

* * * * *